United States Patent [19]

Namatsu et al.

[11] Patent Number: 4,738,916
[45] Date of Patent: Apr. 19, 1988

[54] INTERMEDIATE LAYER MATERIAL OF THREE-LAYER RESIST SYSTEM

[75] Inventors: Hideo Namatsu; Akira Yoshikawa, both of Isehara, Japan

[73] Assignee: Nippon Telegraph and Telephone Corp., Tokyo, Japan

[21] Appl. No.: 884,977

[22] Filed: Jul. 14, 1986

Related U.S. Application Data

[62] Division of Ser. No. 742,100, Jun. 6, 1985, Pat. No. 4,615,782.

[30] Foreign Application Priority Data

Jun. 11, 1984 [JP] Japan .................. 59-119385

[51] Int. Cl.⁴ .............................................. G03C 1/76
[52] U.S. Cl. ................................. 430/272; 430/273; 430/312; 430/523; 528/10
[58] Field of Search ............ 430/272, 273, 523, 312, 430/271, 961; 528/10, 39

[56] References Cited

U.S. PATENT DOCUMENTS

| | | |
|---|---|---|
| 3,873,361 | 3/1975 | Franco et al. |
| 4,004,044 | 1/1977 | Franco et al. ................. 427/43.1 |
| 4,024,041 | 5/1977 | Hanazono et al. ............. 204/192 C |
| 4,244,799 | 1/1981 | Fraser et al. ................... 204/192 E |
| 4,388,449 | 6/1983 | Bonnet et al. ................. 525/477 |
| 4,473,435 | 9/1984 | Zafiropoulo et al. .......... 156/643 |

FOREIGN PATENT DOCUMENTS

| | | |
|---|---|---|
| 031463 | 7/1981 | European Pat. Off. |
| 0112168 | 6/1984 | European Pat. Off. |
| 123560 | 10/1984 | European Pat. Off. |

OTHER PUBLICATIONS

Rosilio et al., "Application of Polysiloxane Resist to Multi-Layer Resist Systems . . . ", Microelectronic Engineering, vol. 1 (3), Nov. 1983.

Microelectronic Engineering, vol. 1, No. 3, Nov. 1983, pp. 197–208, Elsevier Science Publishers B.V., (North-Holland), Amsterdam, NL; C. Rosilio et al.: "Application of Polysiloxane Resists to Multilayer Resists Systems for High-Resolution Microlithography", p. 199, paragraphs 1,2; p. 205.

Primary Examiner—Nancy A. B. Swisher
Assistant Examiner—José G. Dees
Attorney, Agent, or Firm—Frishauf, Holtz, Goodman & Woodward

[57] ABSTRACT

An intermediate layer material of a three-layer resist system for use in processing of a semiconductor substrate, comprising an organopolysiloxane. The organopolysiloxane is expressed by a general formula $(R_3SiO_{\frac{1}{2}})_m \cdot (R_2SiO)_n \cdot (RSiO_{3/2})_p \cdot (SiO_2)_q$ {where R is independently a hydrocarbon group or an alkoxy group; and m, n, p and q represent composition ratios of respective units and satisfy $m+n+p+q=1$, $1 \geq m > 0$, $1 \geq n \geq 0$, $1 \geq p \geq 0$, $1 \geq q \geq 0$ (where p and q are not simultaneously 0), $m/p \leq 0.3$ (where $p \neq 0$), and/or $m/q \leq 1$ (where $q \neq 0$)}.

11 Claims, 2 Drawing Sheets

INTERMEDIATE LAYER MATERIAL OF THREE-LAYER RESIST SYSTEM

This is a division of application Ser. No. 742,100 filed June 6, 1985, now U.S. Pat. No. 4,615,782.

BACKGROUND OF THE INVENTION

1. Field of the Invention

The present invention relates to a resist material suitably used for an intermediate layer of a three-layer resist system used when a semiconductor substrate is processed, and to a method of forming a resist pattern using such an intermediate layer material.

2. Description of the Prior Art

Semiconductor devices such as semiconductor integrated circuits are increasing being integrated at high density. With this tendency, fine-line patterning techniques characterized by high resolution and good linewidth control are required. Recent lithography techniques used for such patterning are versatile and include reduction projection printing using near ultraviolet exposure, electron beam direct writing, and X-ray exposure.

In the manufacturing process of semiconductor elements, topographical structures frequently generate on a substrate, and predetermined processing must be performed on such a nonplanar surface including a step. However, a resist layer applied to a nonplanar surface brings about a variable thickness. As a result, irrespective of the exposure method adopted, a resist pattern obtained upon development is made non-uniform across the step.

Along with further reduction of a resist pattern size, the influence of a substrate on exposure radiation becomes notable and poor linewidth control is brought about. For example, in the case of optical exposure, a standing wave is produced by reflected light from a substrate. In the case of electron beam exposure, a proximity effect due to reflected electrons occurs. With such phenomena, the resolution and linewidth control of resist patterns are limited.

A so-called three-layer resist system is known as a process to resolve the above problems (see U.S. Pat. No. 4,244,799). This system includes coating a bottom resist layer of an organic polymeric material on a substrate with topography. The bottom resist layer planarize the topography. Thereafter, an intermediate layer is formed on the bottom resist, and a top resist layer of a radiation-sensitive polymeric material is formed thereover.

The top resist layer is patterned by conventional exposure and development techniques. Using the top patterning resist layer as a mask, the intermediate layer is etched. Thereafter, using the obtained intermediate layer pattern as a mask, the bottom resist layer is etched.

According to this three-layer resist system, the intermediate and top resist layers are formed on a planar surface of the bottom resist layer. Therefore, the thin top resist layer to be exposed is coated uniformly, and can be patterned with high resolution. In addition, since the top resist layer is spatially separated from the substrate by a relatively thick bottom resist layer, adverse influence of the substrate on exposure radiation can be reduced. Thus, the three-layer resist system performs high-resolution and good linewidth control.

Despite the advantages of the three-layer resist system as described above, the system requires extra processing steps. In particular, since etching of a bottom resist layer is normally performed by reactive ion etching (RIE) using oxygen, the intermediate layer must be made of a material having resistance to $O_2$ RIE, i.e., inorganic materials such as silicon, silicon oxide or aluminum. Such an inorganic material is normally formed into a film by evaporation, sputtering or chemical vapor deposition (CVD). These techniques need vacuum equipments which are very costly, and are not so efficient.

In view of this disadvantage, a material capable of being spin-coated if used for the intermediate layer as in the top and bottom resist layers. For example, U.S. Pat. No. 4,244,799 discloses the use of spin on glass (SOG) as an intermediate layer material. However, in order to obtain a stable film of SOG by dehydration condensation of silanol groups, the coated film must be baked at a high temperature above about 200° C. When SOG is exposed to such a high temperature, the bottom resist layer is thermally modified and does not allow easy removal when it must later be removed. In addition, if the baking of SOG is insufficient, it may crack upon development of the top resist layer. SOG gellates or hardens over time causing clogging of a spin coating nozzle and preventing storage over a long period of time.

U.S. Pat. No. 4,244,799 and U.S. Pat. No. 4,004,044 disclose the use of organopolysiloxanes (so-called silicone resins) for intermediate layers. Since organopolysiloxanes are soluble in organic solvents, they can be spin-coated. Usually, they are baked to cure (crosslink) after coating. The baking temperature is relatively low, i.e., about 100° C. and curing does not therefore modify the bottom resist layer. Since organopolysiloxanes have siloxane bonds, they have satisfactory resistance to oxidation and hence required resistance to $O_2$ RIE. However, as in the case of SOG, conventional organopolysiloxanes change over time, cannot be dissolved in organic solvents after being cured and thereupon cannot be removed. Unless cured, organopolysiloxanes have low thermal softening points and flow due to heat during prebaking or postbaking of a top resist layer, thus preventing formation of a top resist pattern.

SUMMARY OF THE INVENTION

It is, therefore, an object of the present invention to provide an intermediate layer material of a three-layer resist system, comprising an organopolysiloxane which does not undergo changes over time, does not require curing, can be dissolved in an organic solvent even after forming a pattern therein, and has a high thermal softening point.

It is another object of the present invention to provide a method of forming a resist pattern using the above intermediate layer material.

In accordance with one aspect of the present invention, there is provided an intermediate layer material comprising an organopolysiloxane expressed by a general formula $(R_3SiO_{\frac{1}{2}})_m \cdot (R_2SiO)_n \cdot (RSiO_{3/2})_p \cdot (SiO_2)_q$ {where R is independently a hydrocarbon group or an alkoxy group; and m, n, p and q represent composition ratios of respective units and satisfy $m+n+p+q=1$, $1 \geq m > 0$, $1 \geq n \geq 0$, $1 \geq p \geq 0$, $1 \geq q \geq 0$ (where p and q are not simultaneously 0), $m/p \leq 0.3$ (where $p \neq 0$), and/or $m/q \leq 1$ (where $q \neq 0$)}.

Generally, each R is a lower alkyl group or lower alkoxy group each having 1 to 8 carbon atoms and is preferably a methyl group.

It is to be noted that n is particularly preferred to be 0.

In accordance with another aspect of the present invention, there is provided a method of forming a three-layer resist pattern, comprising the steps of sequentially forming a bottom resist layer having a flat surface, an intermediate layer, and a radiation-sensitive top resist layer on a substrate to be processed, patterning the top resist layer into a predetermined pattern, etching the intermediate layer using the top resist pattern as a mask to form an intermediate layer pattern, and etching the bottom resist layer using the intermediate layer pattern as a mask. In this method, an organopolysiloxane as defined above according to the present invention is used for the intermediate layer.

"Radiation-sensitive" as used herein refers to a material which is decomposed or crosslinked upon irradiation with radidation, e.g., light, X-rays, or electron beam.

DESCRIPTION OF THE PREFERRED EMBODIMENTS

Figure 1A:
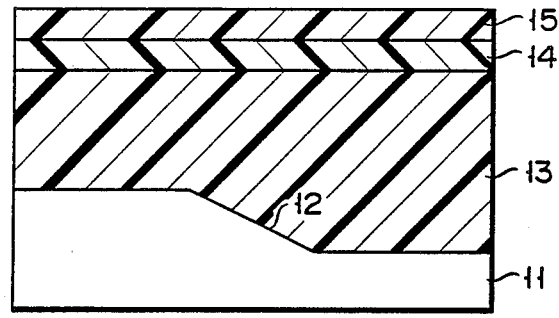
FIGS. 1A to 1D are sectional views for explaining formation of a three-layer resist pattern using an intermediate layer material according to the present invention.

The present inventors have made extensive studies to find an intermediate layer material of a three-layer resist system, which can be spin-coated, does not change over time (crosslink or the like), can be easily dissolved in a solvent, and has a relatively high thermal softening point. As a result, they found out that an organopolysiloxane expressed by a general formula (I) $(R_3SiO_{\frac{1}{2}})_m \cdot (R_2SiO)_n \cdot (RSiO_{3/2})_p \cdot (SiO_2)_q$ {where R is independently a hydrocarbon group or an alkoxy group; and m, n, p and q represent composition ratios of respective units and satisfy $m+n+p+q=1$, $1 \geq m > 0$, $1 \geq n \geq 0$, $1 \geq p \geq 0$, $1 \geq q \geq 0$ (where p and are not simultaneously 0), $m/p \leq 0.3$ (where $p \neq 0$), and/or $m/q \leq 1$ (where $q \neq 0$)} satisfies all these requirements.

Each R is preferably a lower alkyl group (e.g., a methyl group or an ethyl group) or a lower alkoxy group (e.g., a methoxy group or an ethoxy group) each having 1 to 8 carbon atoms. Lower alkyl groups are preferable. A methyl group is particularly preferable among lower alkyl groups.

In general, when organopolysiloxanes are three-dimensionally crosslinked and hardened, the molecular weights are increased and the resultant organopolysiloxanes become insoluble in organic solvents. Therefore, when an organopolysiloxane is used for an intermediate layer of a three-layer resist system, in order to retain solubility in an organic solvent, it must not crosslink upon temperature increase in a baking for removing the solvent after film forming by spin coating or in etching of the film; it must not have a crosslinking component in the molecular structure. If an organopolysiloxane does not have a crosslinking component in its molecular structure, it does not undergo change over time.

Crosslinking of an organopolysiloxane is caused by the presence of hydroxyl group, hydrogen atom or a group (e.g., a vinyl group) having a double bond according to the following formulas:

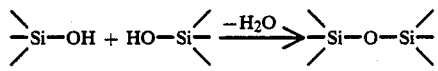

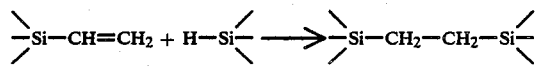

Therefore, from the viewpoint of the structure of organopolysiloxanes, it is advantageous to reduce or eliminate the crosslinking groups. For this reason, in the formula (I) representing an organopolysiloxane according to the present invention, R is a hydrocarbon group or an alkoxy group. The hydrocarbon group is preferably saturated.

R preferably satisfies another condition. In a test conducted, two different organopolysiloxanes (samples A and B) having different contents of an organic group were spin-coated to a thickness of 0.2 μm on silicon wafers. The films were placed in a 0.01 Torr carbon tetrafluoride atmosphere and 100 W RF power (13.36 MHz) was applied to etch the organopolysiloxanes. The organopolysiloxanes were etched at the rates indicated below.

TABLE A

| Sample | Organic Group Content | Etch Rate |
|---|---|---|
| A | 26% by weight | 51 nm/min |
| B | 40% by weight | 20 nm/min |

It is seen from the above results that an organopolysiloxane having a lower organic group content has a higher etch rate. This is because the organic group prevents that the framework of the organopolysiloxane reacts with the fluorine generated from carbon tetrafluoride in accordance with the following formula:

$$Si + xF \rightarrow SiF_x \uparrow$$

For these reasons, each R in the formula (I) above is preferably a lower hydrocarbon group or a lower alkoxy group having a smaller number of carbon atoms. "Lower" herein means a group having 1 to 8 carbon atoms.

From the above, each R is preferably a lower alkyl group or a lower alkoxy group having 1 to 8 carbon atoms. Furthermore, from the viewpoint of ease in manufacture, each R is preferably a lower alkyl group rather than a lower alkoxy group. Therefore, each R is most preferably a methyl group.

In order that an organopolysiloxane be soluble in an organic solvent, it must not crosslink. However, conventional organopolysiloxanes have thermal softening points near 50° to 70° C. unless crosslinked. The "thermal softening point" used herein is a temperature at which an organopolysiloxane starts thermal deformation when placed on a hotplate and observed through a microscope. Radiation-sensitive resist materials normally used for the top resist are baked at temperatures indicated in Table B below:

TABLE B

| Radiation-Sensitive Resist | Baking Temperature |
|---|---|
| AZ-1350* | 80–90° C. |
| OFPR** | 80–90° C. |

TABLE B-continued

| Radiation-Sensitive Resist | Baking Temperature |
|---|---|
| PMMA*** | >104° C. |
| FPM**** | >93° C. |
| PBS***** | 100° C. |
| CMS****** | 90° C. |

*Photoresist available from Hoechst Corporation (Novolac resin added with photosensitive material)
**Photoresist available from Tokyo Ohka Kogyo, Japan (Novolac resin added with photosensitive material)
***Polymethyl methacrylate
****Poly (1,1-dimethyl-2,2,3,3-tetrafluoropropyl methacrylate)
*****Poly (butene-1 sulfone)
******Chloromethylated polystyrene As can be seen from the above Table B, any radiation-sensitive resist has a baking treatment temperature higher than the thermal softening point of any conventional organopolysiloxane. Therefore, when a top resist layer is formed on a conventional organopolysiloxane and is baked, the organopolysiloxane is deformed or flows. Even if the baking is performed at a low temperature of 50° C. or lower, the substrate temperature is increased to about 80° C. during subsequent $O_2$ RIE of the bottom resist layer, resulting in the same problem again.

For this reason, an organopolysiloxane used for an intermediate layer of a three-layer resist system must have a thermal softening point of 80° C. or higher.

In order to satisfy this requirement, the ratio of the respective units of an organopolysiloxane represented by the above formula is important. First, when the content of ($R_2SiO$) units is high, the organopolysiloxane is rendered a linear chain polymer and has a low thermal softening point. Therefore, n is as small as possible and is preferably O.

It has been found that when organopolysiloxanes having a formula $(R_3SiO_{\frac{1}{2}})_m \cdot (SiO_2)_q$ (where $q \neq 0$) are prepared, one satisfying m/q=1 has a thermal softening point of about 80° C., one satisfying m/q=0.9 has a thermal softening point of about 130° C., and one satisfying m/q=0.85 has a thermal softening point of about 150° C. or higher. Also, it has been found that when organopolysiloxanes having a formula $(R_3SiO_{\frac{1}{2}})_m \cdot (RSiO_{3/2})_p$ (where $p \neq 0$) are prepared, one satisfying m/p=0.3 has a thermal softening point of about 80° C., one satisfying m/p=0.2 has a thermal softening point of about 130° C., and one having a smaller value of m/p has a still higher thermal softening point.

In order to maintain the thermal softening point of the organopolysiloxane at 80° C. or higher, the following conditions must be satisified: $m/q \leqq 1$ (preferably $\leqq 0.9$) and/or $m/p \leqq 0.3$ (preferably $\leqq 0.2$) in formula (I).

An organopolysiloxane according to the present invention can be prepared by a method known per se. Simply explained, $RSiCl_3$ (e.g., methyltrichlorosilane) is used as a supply source of ($RSiO_{3/2}$) units, $R_2SiCl_2$ (e.g., dimethyldichlorosilane) is used as a supply source of ($R_2SiO$) units, $R_3SiCl$ (e.g., trimethylchlorosilane) is used as a supply source of ($R_3SiO_{\frac{1}{2}}$) units, and tetraalkoxysilane or silicon tetrachloride is used as a supply source of ($SiO_2$) units. After one of the reactants is dissolved in an organic solvent such as toluene and the pH and temperature of the resultant solutioh are adjusted, the other reactants are added to cause reaction. The reaction progresses almost quantitatively. The molar ratios of the respective reactants are selected to coincide with the ratios of the respective units of an organopolysiloxane to be obtained. After the reaction is terminated, the reaction mixture is heated to substantially remove residual hydroxy groups. The solvent used, e.g., toluene, may be removed, and the organopolysiloxane may be dissolved in the other solvent such as n-hexane at a concentration of 5 to 10% by weight. The resultant solution can be used in subsequent spin-coating.

Organopolysiloxanes according to the present invention generally have molecular weights of about 300 to 50,000.

Organopolysiloxanes according to the present invention are soluble in hydrocarbon solvents such as n-hexane; ketones such as acetone; aromatic solvents such as benzene, toluene or xylene; ester solvents such as isoamyl acetate; or a solvent mixture of o-dichlorobenzene with tetrachloroethylene.

In order to form a resist pattern, an organopolysiloxane according to the present invention can be used for an intermediate layer of a three-layer resist system as disclosed in the above-mentioned U.S. Pat. No.

For example, as shown in FIG. 1A, a commercially available resist material or another spin-coatable organic polymeric material is spin-coated on a semiconductor substrate 11 with a step 12. The coated resist material is baked to form a bottom resist layer 13. The lower resist layer 13 serves to substantially eliminate the step 12 and is formed sufficiently thick to provide a planar surface. The layer 13 normally has a thickness of 1 to 2 μm.

An organopolysiloxane according to the present invention is spin-coated on the bottom resist layer 13. The coated organopolysiloxane is baked to form an intermediate layer 14. The baking temperature of the organopolysiloxane according to the present invention depends on the type of solvent used but is normally about 100° C. When a readily volatile solvent is used, the baking can be omitted. The intermediate layer 14 normally has a thickness of about 0.2 μm. In order to improve the exposure characteristics of a top resist layer to be described below, an additive may be added in the organopolysiloxane. For example, in order to suppress the standing wave effect, a light-absorption agent for absorbing light of an exposure wavelength range can be added.

Thereafter, a radiation-sensitive organic polymeric material (e.g., a material indicated in Table B) such as a photoresist, an X-ray resist, or an electron resist is coated on the intermediate layer 14 and is baked to form a top resist layer 15. Depending upon the type of solvent used for the radiation-sensitive material, the organopolysiloxane forming the intermediate layer may be dissolved. In such a case, a surface layer of the organopolysiloxane is oxidized to a depth of several nanometers by ultraviolet radiation in ozone or by $O_2$ plasma treatment of very short duration. The top resist layer is formed on the oxide film thus formed.

Figure 1B:
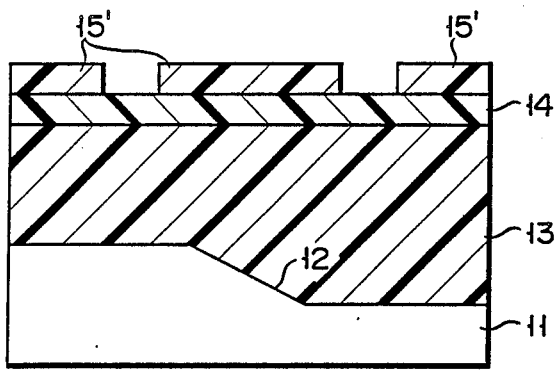

Then, as shown in FIG. 1B, a predetermined pattern 15' is formed in the top resist layer 15 by a known exposure/development method.

Figure 1C:
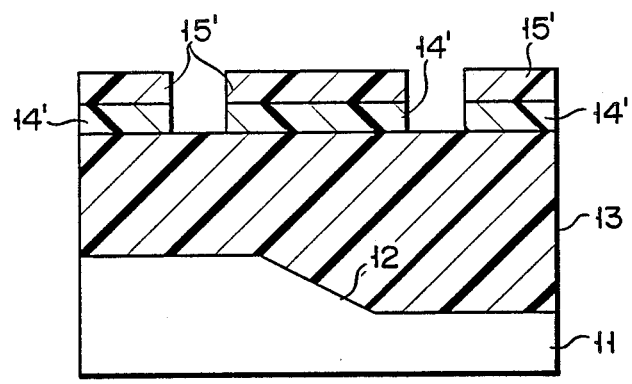

As shown in FIG. 1C, the intermediate layer 14 is etched using the top resist pattern 15' as a mask so as to form an intermediate layer pattern 14'. The intermediate layer 14 is etched using a gas plasma containing fluorine or chlorine. Examples of gases for etching the intermediate layer may include carbon tetrafluoride ($GF_4$), a mixture of $CF_4$ with oxygen or hydrogen, hexafluoroethane, sulfur hexafluoride, and carbon tetrachloride.

Figure 1D:
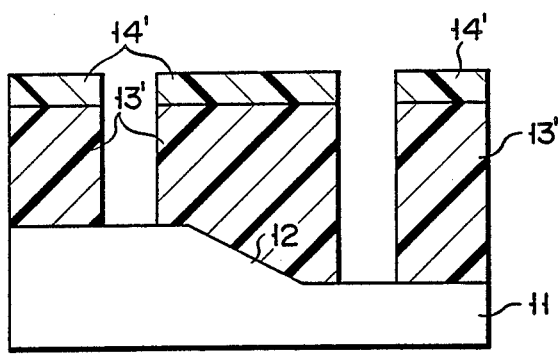

Thereafter, the bottom resist layer 13 is etched using the intermediate layer pattern 14' as a mask to form a bottom resist pattern 13'. The bottom resist layer 13 is normally etched by RIE using oxygen gas. When this RIE is performed, the top resist pattern 15' is removed (FIG. 1D).

After the intermediate layer pattern 14' is removed, the substrate 11 is etched using the lower bottom pattern 13' as a mask. The bottom resist pattern 13' is then removed.

The etching of the substrate 11 can be performed before removal of the intermediate layer pattern 14'. In this case, after the substrate 11 is processed, the intermediate layer pattern 14' and the bottom resist pattern 13' are dissolved and removed with an organic solvent sequentially or simultaneously. The oxide layer formed on the surface of the intermediate layer 14 by the above-noted treatment of the surface of the intermediate layer or $O_2$ RIE of the bottom resist is removed when the substrate is etched. For this reason, the intermediate layer pattern 14' of an organopolysiloxane according to the present invention can be easily removed by the organic solvent as enumerated above.

However, when the intermediate layer pattern 14' is removed before etching of the semiconductor substrate, the oxide on the surface of the intermediate layer pattern 14' prevents removal by an organic solvent. In this case, in order to remove the oxide layer on the intermediate layer pattern 14', the intermediate layer pattern surface can be exposed to hydrofluoric acid or buffered hydrofluoric acid for an extremely short duration. The oxide layer can also be removed by exposure to plasma of a fluorine-containing gas such as enumerated above for a short period of time (e.g., about one minute when $CF_4$ is used at a pressure of 0.05 Torr with RF power of 50 W). However, if the uppermost layer of the substrate 11 is an Al film, Al is rapidly corroded by the acids noted above. Therefore, in this case, a solution mixture of ethylene glycol and buffered hydrofluoric acid is preferably used. This solution mixture is reported by T. A. Schankoff et al in J. Electrochem. Soc., 1978, 125 (3), 467 and can remove aluminum oxide or silicon oxide without corroding Al. The present inventors found out that this solution mixture is also effective in removing an oxide formed on an organopolysiloxane according to the present invention. More specifically, the substrate is immersed in the solution mixture to remove the oxide layer from the surface of the organopolysiloxane. Thereafter, the substrate is washed with water and dried, and is then washed with an organic solvent to completely remove the organopolysiloxane. When the substrate is immersed in the solution mixture, the oxide on the substrate 11 which is formed during $O_2$ RIE of the bottom resist layer 13 can also be removed to facilitate etching of the substrate 11.

Although the present invention will now be described below by way of its Examples, it is to be noted that the present invention should not be limited thereto.

EXAMPLE 1

An organopolysiloxane was prepared in toluene using trimethylchlorosilane and tetramethoxysilane as starting materials. The organopolysiloxane satisfied the conditions n=0, p=0, m/q=0.9, and each R=methyl in formula (I) above. This resin had a molecular weight distribution of 300 to 50,000. The toluene was removed from the resin solution, and the resin was dissolved in n-hexane at a concentration of 5 to 10% by weight.

A photoresist "AZ-1350J" (available from Hoechst Corporation) was spin-coated to a thickness of 1.5 μm as a bottom resist layer on a silicon substrate having a 0.2 μm thick Al film as an uppermost layer. The resist was baked in a nitrogen atmosphere at 150° C. for 30 minutes.

The organopolysiloxane prepared above was spin-coated on the bottom resist layer to a thickness of 0.2 μm as an intermediate layer. The surface of the organopolysiloxane was exposed for 30 seconds to an oxygen plasma produced by applying 50 W RF power of 13.56 MHz frequency in an oxygen flow of 50 sccm and an oxygen pressure of 0.1 Torr. A negative electron resist "CMS" (top resist) was spin-coated on the organopolysiloxane treated in this manner to a thickness of 0.4 μm, and baked at 90° C. During this baking, no deformation was observed on the intermediate layer.

The top resist layer was exposed to an electron beam and was developed to form a desired top resist pattern. Thereafter, the organopolysiloxane was etched by RIE using a gas mixture of carbon tetrafluoride and hydrogen (25% by volume) and at a 300 W RF power of 13.56 MHz frequency and a gas mixture pressure of 0.01 Torr, and using the top resist pattern as a mask. An intermediate layer pattern was thus formed. The bottom resist pattern was etched using the intermediate layer pattern as a mask and under the same etching conditions as for the organopolysiloxane except that the etching gas in this case was oxygen. The top resist pattern was also etched in this etching step. A desired resist pattern was thus formed.

The Al film was plasma-etched using the resist pattern as a mask at a 300 W RF power, a carbon tetrachloride flow rate of 50 sccm and a carbon tetrachloride pressure of 0.2 Torr. Thereafter, the substrate was immersed in a solvent mixture of o-dichlorobenzene-tetrachloroethylene heated to 100° C. to remove the intermediate layer pattern and the bottom resist pattern. Thus, an Al pattern having a line width of 0.5 μm was obtained.

EXAMPLE 2

An organopolysiloxane was prepared in toluene using trimethylchlorosilane and tetramethoxysilane as starting materials. The organopolysiloxane satisfied the conditions n=0, p=0, m/q=0.85, and each R=methyl in formula (I) above. This resin had a molecular weight distribution of 300 to 35,000.

A photoresist "AZ-1350J" was spin-coated to a thickness of 1.5 μm as a bottom resist layer on a silicon substrate having a 0.2 μm thick Al film as an uppermost layer. The resist was baked in a nitrogen atmosphere at 200° C. to 30 minutes.

The organopolysiloxane prepared above was spin-coated on the bottom resist layer to a thickness of 0.2 μm as an intermediate layer. A positive electron resist "FBM-G" (copolymer of 2, 2, 3, 4, 4, 4-hexafluorobutyl methacrylate with glycidyl methacrylate) (top resist) was spin-coated on the organopolysiloxane intermediate layer to a thickness of 0.5 μm, and was baked at 140° C. During this baking, no deformation was obserbed on the intermediate layer.

The top resist layer was exposed to an electron beam and was developed to form a desired top resist pattern. Thereafter, as in Example 1, the intermediate layer and the bottom resist layer were etched to form a desired resist pattern. The Al film was etched thereafter following the procedures of Example 1.

The intermediate layer pattern was removed by dissolving in acetone. The bottom resist pattern was removed using a cylindrical plasma etching apparatus at an oxygen gas pressure of 1 Torr and an RF output power of 200 W. Thus, an Al line and space pattern having a line width of 0.5 μm was obtained.

EXAMPLE 3

Organopolysiloxanes were prepared in toluene using trimethylchlorosilane and methyltrichlorosilane, and trimethylchlorosilane and tetramethoxysilane, as starting materials, respectively. The organopolysiloxanes satisfied the conditions $n=0$, $p=0$, $m/p=0.3$, and each $R$=methyl; and the conditions of $n=0$, $p=0$ and $m/q=0.85$, respectively, in formula (I) above. These resins were mixed in a weight ratio of 1:1. The mixed resin had a molecular weight distribution of 300 to 35,000 and two peaks at 1,500 and 30,000.

A photoresist "AZ-1350J" was spin-coated to a thickness of 1 μm as a bottom resist layer on a silicon substrate having a 0.3 μm thick poly-Si film as an uppermost layer. The resist was baked in a nitrogen atmosphere at 150° C. for 30 minutes.

The organopolysiloxane mixture prepared above was spin-coated on the bottom resist layer to a thickness of 0.2 μm as in intermediate layer. The surface of the coated organopolysiloxane mixture was exposed for 30 seconds to an oxygen plasma produced by applying 50 W RF power of 13.56 MHz frequency in an oxygen flow of 50 sccm and an oxygen pressure of 0.1 Torr. A photoresist "AZ-1350J" (top resist) was spin-coated on the organopolysiloxane mixture treated in this manner to a thickness of 1 μm, and baked at 90° C. During this baking, no deformation occurred in the intermediate layer.

The top resist layer was exposed to ultraviolet rays (436 nm) and developed to form a desired top resist pattern. The intermediate layer and the bottom resist layer were etched following the same procedures as in Example 1 to obtain a desired resist pattern.

The poly-Si film was plasma-etched using the resist pattern as a mask and an RF output power of 500 W, a dichlorodifluoromethane flow rate of 25 sccm and a dichlorodifluoromethane pressure of 0.1 Torr. Thereafter, the substrate was immersed in a solvent mixture of o-dichlorobenzene-tetachloroethylene heated to 100° C. so as to dissolve the intermediate layer pattern and the bottom resist pattern. In this manner, a poly-Si pattern having a line width of 1 μm was obtained.

EXAMPLE 4

An organopolysiloxane was prepared in toluene using trimethylchlorosilane and tetramethoxysilane as starting materials. The organopolysiloxane satisified the conditions $n=0$, $p=0$, $m/q=0.49$, and each $R$=methyl in formula (I) above. This resin had a molecular weight distribution of 300 to 50,000.

A photoresist "AZ-1350J" was spin-coated to a thickness of 1.5 μm as a bottom resist layer on a silicon substrate having a 0.3 μm thick poly-Si film as an uppermost layer. The resist was baked in a nitrogen atmosphere at 200° C. for 30 minutes. The organopolysiloxane prepared above was spin-coated on the bottom resist layer to a thickness of 0.2 μm as an intermediate layer. A pattern of an electron beam resist "CMS" was formed on the intermediate layer following the same procedures as in Example 1. The resultant top resist layer was exposed and developed, and then the intermediate layer and the bottom resist layer were etched following the same procedures an in Example 1.

Thereafter, the substrate was immersed in a solution mixture of ammonium fluoride and hydrofluoric acid in a volume ratio of 10:1 for 1 minute. After washing with water and drying, the substrate was washed in xylene to remove the intermediate layer pattern. The poly-Si film was etched using the remaining bottom resist pattern as a mask following the same procedures as in Example 3. The bottom resist pattern was removed thereafter to provide a poly-Si pattern having a line width of 0.5 μm.

EXAMPLE 5

An organopolysiloxane was prepared in toluene using trimethylchlorosilane and tetramethoxysilane as starting materials. The organopolysiloxane satisfied the conditions $n=0$, $p=0$, $m/q=0.56$, and each $R$=methyl in formula (I) above. This resin had a molecular weight distribution of 300 to 50,000.

A three-layer resist system was prepared. The system was the same as that in Example 1 except that the Al film had a thickness of 0.5 μm and the intermediate layer material used was the organopolysiloxane prepared in this Example. The top resist layer was exposed and developed, and the intermediate layer and the bottom resist layer were etched as in Example 1. Thereafter, the substrate was immersed in a solution mixture of ethylene glycol, ammonium fluoride and hydrofluoric acid in a volume ratio of 100:100:3 for 30 seconds so as to remove the oxide on the intermediate layer. After washing with water and drying, the substrate was washed in xylene to remove the intermediate layer pattern. Finally, following the same procedures as in Example 1, the Al film was etched, and the bottom resist pattern was removed to obtain an Al pattern having a line width of 0.5 μm.

COMPARATIVE EXAMPLE

An organopolysiloxane was prepared in toluene using trimethylchlorosilane and trimethylmonochlorosilane as starting materials. The organopolysiloxane satisfied the conditions $n=0$, $p=0$, $m/p=0.4$, and each $R$=methyl in formula (I) above.

A bottom resist layer, an intermediate layer of the organopolysiloxane prepared above, and a top resist layer were sequentially formed on a silicon substrate. When the top resist layer was baked at 120° C., the intermediate layer cracked over its entire surface. Even when the baking of the top resist layer was omitted, when the bottom resist layer was etched (using $O_2$ RIE), the intermediate layer cracked over its entire surface.

As has been described above, organopolysiloxanes according to the present invention are free from the problems with the conventional organopolysiloxanes, do not undergo change over time, are soluble in organic solvents even after formation of a pattern therein, and have high thermal softening points. When an organopolysiloxane according to the present invention is used for an intermediate layer of a three-layer resist system, the method of forming a three-layer system which has been conventionally complex in procedure is rendered simple. Particularly since an organopolysiloxane according to the present invention retains solubility in an organic solvent even after formation of pattern therein, a high throughput of multilayer resist systems can be obtained. Therefore, a multilayer resist process indispensable to the manufacture of various solid-state elements such as VLSIs is established, and patterns in the order of submicrons can be formed. Although the organopolysiloxanes according to the present invention do not contain crosslinking groups as described above, they can contain small amounts of crosslinking groups if these groups do not cause crosslinking of the resins as a whole (or if these groups does not affect the solubility of the organopolysiloxanes in organic solvents after formation of a pattern in the intermediate layer). In other words, the organopolysiloxanes according to the present invention do not substantially contain crosslinking groups.

What is claimed is:

1. In a three-layer resist system for use in processing of a semiconductor substrate comprising a bottom layer, an intermediate layer on said bottom layer, and a top layer of radiation sensitive material on said intermediate layer, the improvement wherein:

said intermediate layer comprises an organopolysiloxane which has a thermal softening point not lower than about 80° C. without crosslinking and is expressed by the general formula $(R_3SiO_{\frac{1}{2}})_m \cdot (R_2SiO)_n \cdot (RSiO_{3/2})_p \cdot (SiO_2)_q$ {where R is independently a hydrocarbon group or an alkoxy group; and m, n, p and q represent composition ratios of respective units nd satisfy m+n+p+q=1, $1 \geq m > 0$, $1 \geq n \geq 0$, $1 \geq p \geq 0$, $1 \geq q \geq 0$ (where p and q are not simultaneously 0), $m/p \leq 0.3$ (where $p \neq 0$), and/or $m/q \leq 1$ (where $q \neq 0$)}.

2. The system of claim 1, wherein n is 0.

3. The system of claim 2, wherein each R is a lower alkyl group or a lower lower alkoxy group.

4. The system of claim 3, wherein each R is methyl group.

5. The system of claim 2 wherein each R is methyl, ethyl, methoxy or ethoxy.

6. The system of claim 1, wherein the organopolysiloxane is soluble in an organic solvent.

7. The system of claim 6, wherein the organopolysiloxane has a molecular weight of about 300 to about 50,000.

8. The system of claim 1, wherein the organopolysiloxane has a structure expressed by a formula $(R_3SiO_{\frac{1}{2}})_m \cdot (RSiO_{3/2})_p$.

9. The system of claim 8 wherein each R is methyl, ethyl, methoxy or ethoxy.

10. The system of claim 1, wherein the organopolysiloxane has a structure expressed by a formula $(R_3SiO_{\frac{1}{2}})_m \cdot (SiO_2)_q$.

11. The system of claim 10 wherein each R is methyl, ethyl, methoxy or ethoxy.

* * * * *